United States Patent
Koezuka et al.

(10) Patent No.: US 9,312,278 B2
(45) Date of Patent: Apr. 12, 2016

(54) DISPLAY DEVICE AND ELECTRONIC DEVICE

(71) Applicants: Junichi Koezuka, Tochigi (JP); Yukinori Shima, Tatebayashi (JP); Yasuharu Hosaka, Tochigi (JP); Kenichi Okazaki, Tochigi (JP); Takuya Matsuo, Osaka (JP); Shigeyasu Mori, Osaka (JP); Yosuke Kanzaki, Osaka (JP); Hiroshi Matsukizono, Osaka (JP)

(72) Inventors: Junichi Koezuka, Tochigi (JP); Yukinori Shima, Tatebayashi (JP); Yasuharu Hosaka, Tochigi (JP); Kenichi Okazaki, Tochigi (JP); Takuya Matsuo, Osaka (JP); Shigeyasu Mori, Osaka (JP); Yosuke Kanzaki, Osaka (JP); Hiroshi Matsukizono, Osaka (JP)

(73) Assignees: Semiconductor Energy Laboratory Co., Ltd., Atsugi-shi, Kanagawa-ken (JP); Sharp Kabushiki Kaisha, Osaka-shi, Osaka (JP)

( * ) Notice: Subject to any disclaimer, the term of this patent is extended or adjusted under 35 U.S.C. 154(b) by 0 days.

(21) Appl. No.: 14/062,085

(22) Filed: Oct. 24, 2013

(65) Prior Publication Data

US 2014/0117350 A1    May 1, 2014

(30) Foreign Application Priority Data

Oct. 30, 2012 (JP) ................................. 2012-238918

(51) Int. Cl.
*H01L 27/12* (2006.01)
*H01L 27/32* (2006.01)

(52) U.S. Cl.
CPC ......... *H01L 27/1225* (2013.01); *H01L 27/3262* (2013.01)

(58) Field of Classification Search
CPC .................... H01L 27/1225; H01L 27/3262
USPC .......................................................... 257/43
See application file for complete search history.

(56) References Cited

U.S. PATENT DOCUMENTS 5,731,856 A    3/1998    Kim et al.
5,744,864 A    4/1998    Cillessen et al.

(Continued)

FOREIGN PATENT DOCUMENTS

EP    1737044 A    12/2006
EP    2226847 A     9/2010

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Tucker J Wright
(74) *Attorney, Agent, or Firm* — Eric J. Robinson; Robinson Intellectual Property Law Office, P.C.

(57) ABSTRACT

To improve the reliability of a transistor as well as to inhibit fluctuation in electric characteristics. A display device includes a pixel portion and a driver circuit portion outside the pixel portion; the pixel portion includes a pixel transistor, a first insulating film covering the pixel transistor and including an inorganic material, a second insulating film including an organic material over the first insulating film, and a third insulating film including an inorganic material over the second insulating film; and the driver circuit portion includes a driving transistor to supply a signal to the pixel transistor, the first insulating film covering the driving transistor, and the second insulating film over the first insulating film, and further includes a region in which the third insulating film is not formed over the second insulating film or a region in which the second insulating film is not covered with the third insulating film.

16 Claims, 5 Drawing Sheets

(56) References Cited

U.S. PATENT DOCUMENTS

| | | | |
|---|---|---|---|
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,791,072 B2 | 9/2010 | Kumomi et al. | |
| 8,237,166 B2 | 8/2012 | Kumomi et al. | |
| 8,269,218 B2 | 9/2012 | Yamazaki | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0132896 A1* | 7/2003 | Matsueda | 345/55 |
| 2003/0173597 A1* | 9/2003 | Kamiya | 257/209 |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0295041 A1 | 11/2010 | Kumomi et al. | |
| 2011/0133181 A1 | 6/2011 | Yamazaki | |
| 2012/0256973 A1* | 10/2012 | Choi et al. | 345/690 |
| 2012/0319118 A1 | 12/2012 | Yamazaki | |
| 2013/0033655 A1* | 2/2013 | Miyamoto | 349/43 |
| 2014/0022479 A1 | 1/2014 | Hosaka et al. | |
| 2014/0022480 A1 | 1/2014 | Yokoyama et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 | 4/2007 |
| JP | 2007-123861 | 5/2007 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digeset of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

(56) References Cited

OTHER PUBLICATIONS

Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applies Physics Letters), Jun. 17, 1996, vol. 68, No. 25, pp. 3650-3652.

Nakamura.M et al., "The phase relations in the In2O3—Ga2ZnO4-ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 8, and 16) in the In2O3—ZnGa2O4—ZnO System,", Journal of Solid State Chemistry, Apr. 1, 1995, Vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MoO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition: The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 in. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007 ,vol. 38, pp. 1673-1673

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

(56) References Cited

OTHER PUBLICATIONS

Lee.H et al., "Current Status of Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Strucutre,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "SPINEL,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] At Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev.Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys.Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08: SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B.(Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

* cited by examiner

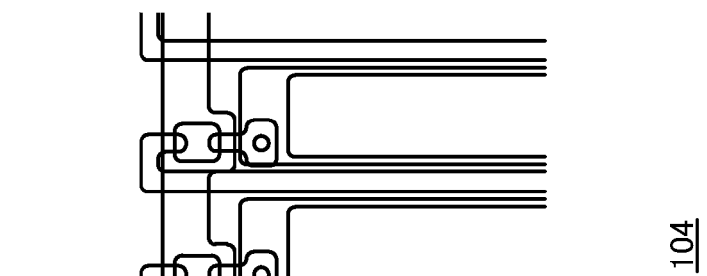
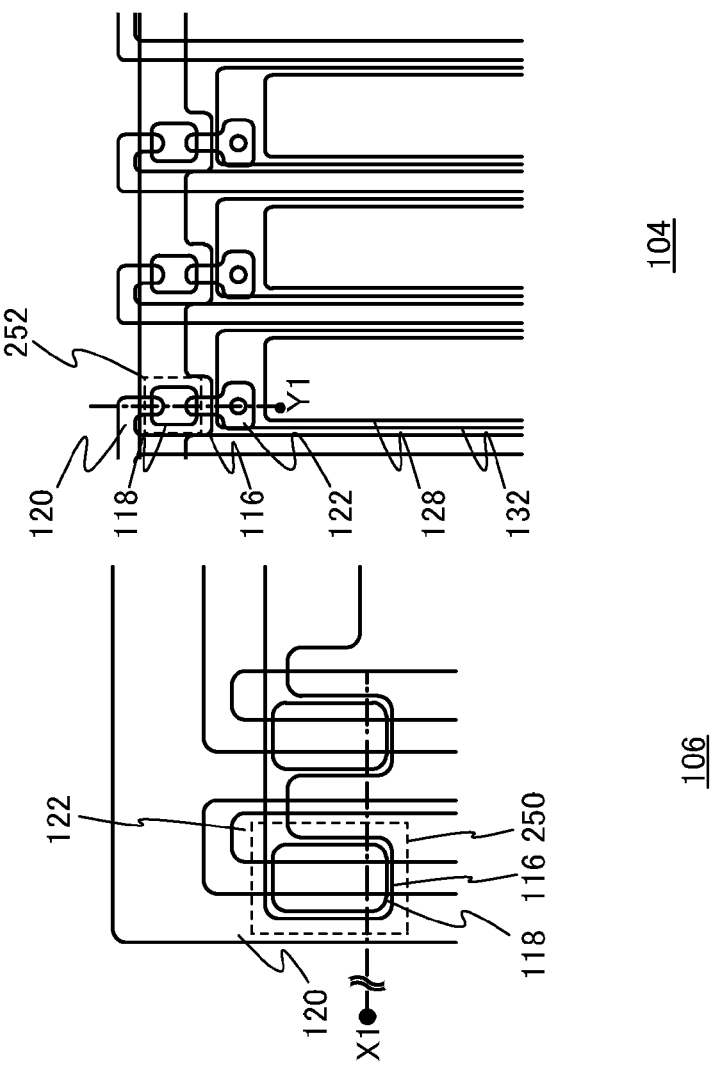
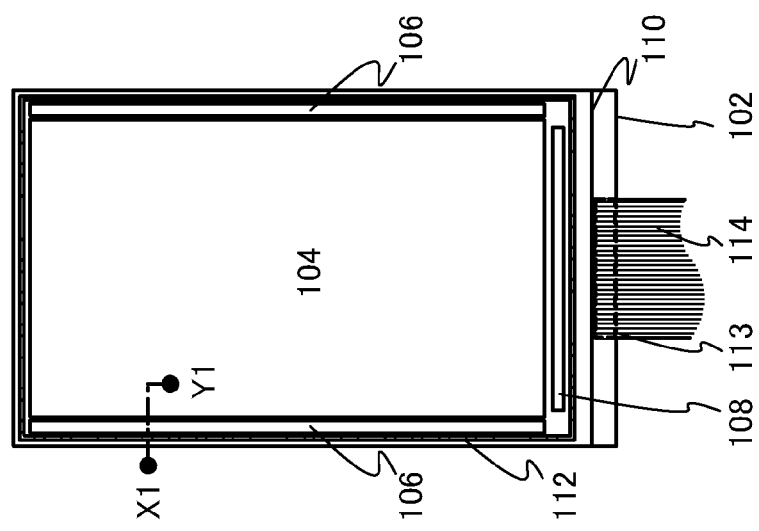

DISPLAY DEVICE AND ELECTRONIC DEVICE

BACKGROUND OF THE INVENTION

1. Field of the Invention

The present invention relates to display devices and electronic devices.

2. Description of the Related Art

In recent years, display devices using liquid crystal panels and display devices using organic EL panels have been under active development. These display devices are broadly classified into display devices in which only transistors for pixel control (pixel transistors) are formed over a substrate and scanning circuits (driver circuits) are included in peripheral ICs and display devices in which scanning circuits are formed over the same substrate as pixel transistors.

Display devices in which driver circuits are integrated with pixel transistors are effective for reduction of the frame width of the display devices or cost of the peripheral ICs. However, transistors used in the driver circuits are required to have better electrical characteristics (e.g., field-effect mobility (μFE) or threshold voltage) than the pixel transistors.

Although a silicon-based semiconductor material has been widely known as a material for a semiconductor thin film applicable to transistors, an oxide semiconductor is attracting attentions as another notable material, (e.g., Patent Documents 1 and 2). For example, a transistor using the following amorphous oxide is drawing attentions: the amorphous oxide contains indium (In), gallium (Ga), and zinc (Zn) and has an electron carrier density of less than $10^{18}/cm^3$.

Transistor using oxide semiconductors for semiconductor layers have higher field-effect mobility than transistors using amorphous silicon of silicon-based semiconductor materials for semiconductor layers. Hence, the transistors using oxide semiconductors can operate at high speed and be suitably used for the display devices in which pixel transistors are integrated with driver circuits. Besides, a manufacturing process of such transistors using oxide semiconductors is easier than a manufacturing process of transistors using polycrystalline silicon for semiconductor layers.

However, a problem of the transistors using oxide semiconductor for semiconductor layers is that entry of impurities such as hydrogen or moisture into the oxide semiconductor generates carriers and changes threshold voltages as one of electrical characteristics of the transistors.

REFERENCE

[Patent Document 1] Japanese Published Patent Application No. 2007-123861

[Patent Document 2] Japanese Published Patent Application No. 2007-096055

SUMMARY OF THE INVENTION

It is important that, for a transistor having a channel formed in an oxide semiconductor layer, hydrogen, moisture, and the like be eliminated from the oxide semiconductor layer as much as possible in order to keep its sufficient electric characteristics.

In particular, when transistors each having a channel formed in an oxide semiconductor layer are used for both a pixel portion and a driver circuit portion formed outside the pixel portion in a display device, the electric characteristics of the transistor used in the driver circuit portion are more important than those of the transistor used in the pixel portion, because the transistor used in the driver circuit portion has a large electric load, although depending on a driving method.

In addition, such a display device using the transistors each having a channel formed in an oxide semiconductor layer for a pixel portion and a driver circuit portion has a problem of deterioration of the transistor used in the driver circuit portion (the transistor is referred to as a driving transistor) when it is subjected to a reliability test under a high-temperature and high-humidity environment. A cause of deterioration of the driving transistor is that moisture and the like released from an organic material provided for reducing unevenness of the transistor cannot be released outside and enters the oxide semiconductor layer, so that the carrier density of the oxide semiconductor layer is increased.

One cause of deterioration of the driving transistor is moisture penetrating from outside of the display device. The deterioration of the driving transistor results from moisture entering the oxide semiconductor layer of the driving transistor.

In view of the above, it is an object of one embodiment of the present invention to inhibit fluctuation in electric characteristics of transistors each having a channel formed in an oxide semiconductor layer and to improve reliability thereof, in a display device using the transistors for a pixel portion and a driver circuit portion. In particular, it is an object of one embodiment of the present invention to inhibit fluctuation in electric characteristics and to improve the reliability by preventing hydrogen and moisture from entering the oxide semiconductor layers used in the transistors in the driver circuit portion.

Impurities such as moisture released from the organic material formed over the driving transistor are diffused outside favorably. Specifically, an opening portion is formed in an organic material and an inorganic material formed over the organic material, and impurities such as moisture contained in the organic material are diffused outside from the opening portion. In addition, moisture penetrating from outside of the display device, which might enter the organic material, and moisture released from the organic material reach an equilibrium state in the whole opening portion, so that moisture is prevented from entering the oxide semiconductor layer of the driving transistor.

A variety of modes of the present invention are described below. One embodiment of the present invention is a display device comprising a pixel portion and a driver circuit portion outside the pixel portion. The pixel portion comprises a pixel transistor, a first insulating film covering the pixel transistor and including an inorganic material, a second insulating film including an organic material over the first insulating film, and a third insulating film including an inorganic material over the second insulating film; the driver circuit portion comprises a driving transistor configured to supply a signal to the pixel transistor, the first insulating film covering the driving transistor, and the second insulating film over the first insulating film; and the driver circuit portion includes a first region in which the third insulating film is not formed over the second insulating film or a second region in which the second insulating film is not covered with the third insulating film.

In the embodiment of the present invention described above, the driver circuit portion preferably comprises the third insulating film over the second insulating film and an opening portion formed in the third insulating film, and the first region or the second region is preferably located below the opening portion.

In the embodiment of the present invention described above, in the driver circuit portion, the opening portion is preferably formed over the driving transistor.

In the embodiment of the present invention described above, the display device preferably includes a non-display region outside the driver circuit portion, and the non-display region preferably comprises the second insulating film over the first insulating film, and preferably has a third region in which the third insulating film is not formed over the second insulating film or a fourth region in which the second insulating film is not covered with the third insulating film.

In the embodiment of the present invention described above, the driver circuit portion preferably comprises the third insulating film covering the driving transistor, over the second insulating film, and an opening portion formed in the third insulating film; and an end portion of the opening portion is preferably located within 200 μm from a center of a channel formation region of the driving transistor.

In the embodiment of the present invention described above, the driver circuit portion preferably comprises the third insulating film covering the driving transistor, over the second insulating film, and an end portion of the third insulating film, which is located within 200 μm from a center of a channel formation region of the driving transistor.

In the embodiment of the present invention described above, a channel of each of the pixel transistor and the driving transistor is preferably formed in an oxide semiconductor layer.

In the embodiment of the present invention described above, each of the pixel transistor and the driving transistor preferably includes a gate electrode, an oxide semiconductor layer over the gate electrode, and a source electrode and a drain electrode over the oxide semiconductor layer.

In the embodiment of the present invention described above, the oxide semiconductor layer preferably contains at least one oxide selected from the group consisting of indium oxide, tin oxide, and zinc oxide.

In the embodiment of the present invention described above, the oxide semiconductor layer is preferably an In—Ga—Zn based oxide semiconductor layer.

In the embodiment of the present invention described above, the oxide semiconductor layer preferably includes a crystal part, and a c-axis of the crystal part is preferably parallel to a normal vector of a surface where the oxide semiconductor layer is formed.

In the embodiment of the present invention described above, the first insulating film is preferably a silicon film including oxygen or nitrogen.

In the embodiment of the present invention described above, the first insulating film preferably has a stacked-layer structure of a silicon oxide film and a silicon nitride film.

In the embodiment of the present invention described above, the first insulating film preferably has a stacked-layer structure of a silicon oxynitride film and a silicon nitride film.

In the embodiment of the present invention described above, the silicon nitride film is preferably formed at a high temperature.

In the embodiment of the present invention described above, the second insulating film is preferably acrylic-based resin material.

In the embodiment of the present invention described above, the third insulating film is preferably a silicon film including nitrogen.

In another embodiment of the present invention, a display device comprising a pixel portion and a driver circuit portion outside the pixel portion; the pixel portion comprises a pixel transistor, a first insulating film covering the pixel transistor and including a silicon film including oxygen, a second insulating film including an acrylic-based resin material over the first insulating film, and a third insulating film including a silicon film including nitrogen over the second insulating film; and the driver circuit portion comprises a driving transistor configured to supply a signal to the pixel transistor, the first insulating film covering the driving transistor, and the second insulating film over the first insulating film; and the driver circuit portion includes a region in which the third insulating film is not formed over the second insulating film or a region in which the second insulating film is not covered with the third insulating film.

In the embodiment of the present invention described above, the pixel portion preferably comprises a first electrode over the second insulating film, the third insulating film over the first electrode, and a second electrode over the third insulating film.

One embodiment of the present invention is an electronic device including the display device.

In accordance with any of embodiments of the present invention, in a display device using transistors each having a channel formed in an oxide semiconductor layer for a pixel portion and a driver circuit portion, fluctuation in electric characteristics of the transistors can be inhibited and the reliability thereof can be improved. In particular, in accordance with any of embodiments of the present invention, the fluctuation in electric characteristics can be inhibited and the reliability can be improved by preventing hydrogen and moisture from entering the oxide semiconductor layer used in the transistor in the driver circuit portion.

BRIEF DESCRIPTION OF THE DRAWINGS

In the accompanying drawings:

FIG. 1A is a top view of the whole display device, FIG. 1B is a top view of a part of a driver circuit portion of the display device, and FIG. 1C is a top view of a part of a pixel portion of the display device;

DETAILED DESCRIPTION OF THE INVENTION

Figure 2:
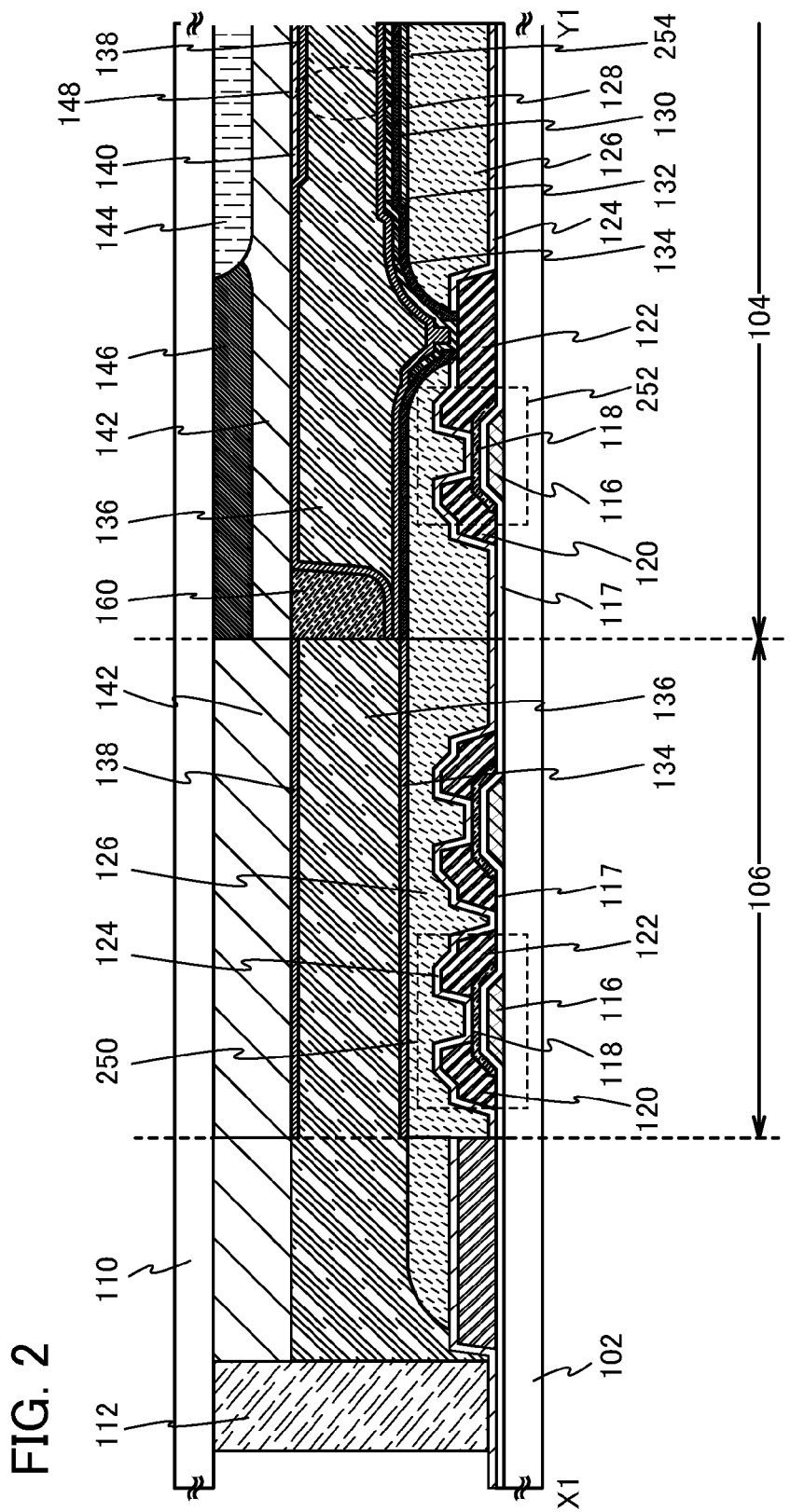
FIG. 2 is a cross-sectional view taken along the line X1-Y1 in FIGS. 1A to 1C.

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Therefore, the present invention should not be construed as being limited to the description in the following embodiments.

In this embodiment, one embodiment of a semiconductor device is described with reference to FIGS. 1A to 1C and FIG. 2.

FIGS. 1A to 1C illustrate top views of the display device as one mode of the display device. FIG. 1A is a top view of the whole display device, FIG. 1B is a top view of a part of a driver circuit portion of the display device, and FIG. 1C is a top view of a part of a pixel portion of the display device. In addition, FIG. 2 corresponds to a cross-sectional view taken along the line X1-Y1 in FIGS. 1A to 1C.

In the display device illustrated in FIG. 1A, a sealant 112 is placed so as to surround a pixel portion 104, and gate driver circuit portions 106 and a source driver circuit portion 108, which are formed over a first substrate 102, and sealing is performed with a second substrate 110. The gate driver circuit portions 106 and the source driver circuit portion 108 are located outside and adjacent to the pixel portion 104 and supply signals to the pixel portion 104. Thus, the pixel portion 104, the gate driver circuit portions 106, and the source driver circuit portion 108 are sealed with the display element by the first substrate 102, the sealant 112, and the second substrate 110.

In FIG. 1A, a flexible printed circuit (FPC) terminal portion 113 which is electrically connected to the pixel portion 104, the gate driver circuit portions 106, and the source driver circuit portion 108 is placed in a region that is different from the region surrounded by the sealant 112, over the first substrate 102. An FPC 114 is connected to the FPC terminal portion 113. Signals and potentials applied to the pixel portion 104, the gate driver circuit portions 106, and the source driver circuit portion 108 are supplied through the FPC 114.

Although an example in which the gate driver circuit portions 106 and the source driver circuit portion 108 are formed over the first substrate 102 where the pixel portion 104 is formed is illustrated in FIG. 1A, this structure does not limit the present invention. For example, only the gate driver circuit portions 106 may be formed over the first substrate 102 and a separately prepared substrate where a source driver circuit is formed (e.g., a driver circuit substrate formed using a single crystal semiconductor film or a polycrystalline semiconductor film) may be mounted on the first substrate 102.

Although a structure in which the two gate driver circuit portions 106 are placed on both sides of the pixel portion 104 is exemplified in FIG. 1A, this structure does not limit the present invention. For example, a gate driver circuit portion 106 may be placed on only one side of the pixel portion 104.

The connection method of such a separately prepared driver circuit substrate is not particularly limited; for example, a chip on glass (COG) method, a wire bonding method, or a tape automated bonding (TAB) method can be used.

As described above, some or all of the driver circuits which include transistors can be formed over the first substrate 102 where the pixel portion 104 is formed, so that a system-on-panel can be obtained.

In FIG. 1B, a driving transistor 250 is formed in the gate driver circuit portion 106 which is a driver circuit. In the driving transistor 250, a gate electrode 116, a source electrode 120, and a drain electrode 120 are electrically connected to a semiconductor layer 118. In the gate driver circuit portion 106, a gate line including the gate electrode 116 extends horizontally, a source line including the source electrode 120 extends vertically, and a drain line including the drain electrode 122 extends vertically with a distance from the source line.

The gate driver circuit portion 106 including the driving transistor 250 can supply a signal to a transistor included in each pixel of the pixel portion 104.

To control various signals, raise a voltage, and the like, the driving transistor 250 in the gate driver circuit portion 106 requires a relatively high voltage, specifically a voltage of about 10 V to 30 V.

Further, in FIG. 1C, a pixel transistor 252 is formed in the pixel portion 104. In the pixel transistor 252, the gate electrode 116, the source electrode 120, and the drain electrode 122 are electrically connected to the semiconductor layer 118.

In addition, the pixel transistor 252 is electrically connected to a pixel electrode 132, and a common electrode 128 is formed to face the pixel electrode 132.

For specific description of the structure of the display device illustrated in FIGS. 1A to 1C, the structure of the gate driver circuit portion 106 and the pixel portion 104 is described below with reference to FIG. 2 corresponding to the cross-sectional view along the line X1-Y1 in FIGS. 1A to 1C.

A display device illustrated in FIG. 2 employs a liquid crystal element as a display element, and a driving mode is a vertical alignment (VA) mode. One mode of the display device is described here.

A layer structure formed over the gate driver circuit portion 106 and the pixel portion 104 is described first.

In the gate driver circuit portion 106, a first insulating film 124 formed of an inorganic material and a second insulating film 126 formed of an organic material over the first insulating film 124 are provided over the driving transistor 250, and in the pixel portion 104, the first insulating film 124, the second insulating film 126 over the first insulating film 124, and a third insulating film 130 formed of an inorganic material over the second insulating film 126 are provided over the pixel transistor 252.

In other words, the third insulating film 130 is not formed in the gate driver circuit portion 106, or after the third insulating film 130 is formed, the third insulating film 130 is removed and thereby the second insulating film 126 is exposed from the third insulating film 130. In other words, the gate driver circuit portion 106 includes a region in which the third insulating film 130 is not formed over the second insulating film 126 or a region in which the second insulating film 126 is not covered with the third insulating film 130.

The second insulating film 126 is formed using an organic material having good flatness in order to reduce unevenness in the transistor and the like included in the display device. The reduction in the unevenness in the transistors and the like leads to an improvement of the display quality of the display device. However, when heating or the like is performed, the organic material releases hydrogen, moisture, or an organic component as a gas.

The above-mentioned gas of hydrogen, moisture, or an organic component is unlikely to be a great problem for a transistor using a silicon film, which is a silicon-based semiconductor material, in a semiconductor layer used for the transistor, for example. However, in one embodiment of the present invention, an oxide semiconductor layer is used for the semiconductor layer, and thus the gas of hydrogen, moisture, or an organic component from the second insulating film 126 formed using an organic material needs to be suitably released.

In addition, for example, when the third insulating film 130 is entirely formed over the gate driver circuit portion 106, in other words, no opening portions are formed, moisture penetrates into a certain region through pin holes or the like that might be generated in the third insulating film 130, a transistor in the certain region deteriorates, and thus the whole gate driver circuit portion fails to operate.

However, as in this embodiment, the third insulating film 130 formed of an inorganic material is not formed over the second insulating film 126 in the gate driver circuit portion 106, or after the third insulating film 130 is formed, the third insulating film 130 is removed so that the second insulating film 126 is exposed from the third insulating film 130, and thereby a gas of moisture and the like released from the second insulating film 126 can be released from the upper portion of the gate driver circuit portion 106. Therefore, the gas of moisture and the like can be prevented from entering the driving transistor 250 and the pixel transistor 252.

In the gate driver circuit portion 106, an opening portion is formed in the third insulating film 130, moisture released from the second insulating film 126 (i.e., moisture from the inside of the display device) and moisture penetrating from the outside of the display device (e.g., atmosphere in a reliability test under a high-temperature and high-humidity environment) are in an equilibrium state in the whole opening portion; therefore, the transistor in the certain region is not broken and thus the reliability of the whole gate driver circuit portion is improved.

Examples of the shapes of the opening portions formed in the third insulating films 130 are described with reference to FIGS. 5A to 5D. FIGS. 5A to 5D are top views of display devices.

Figure 5A:
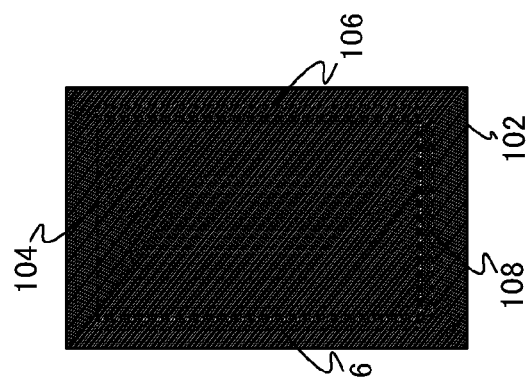
FIGS. 5A to 5D are each a top view of an opening portion in a third insulating film in a display device.
Figure 5B:
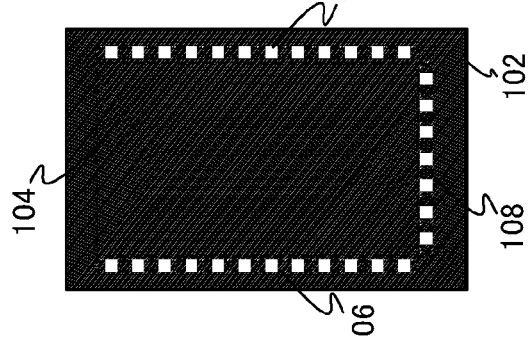
Figure 5C:
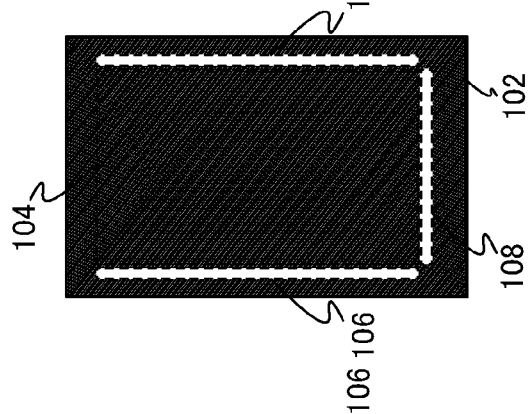

The display device illustrated in FIG. 5A includes the first substrate 102 and the pixel portion 104, the gate driver circuit portions 106, and the source driver circuit portion 108 provided over the first substrate 102. Note that the source driver circuit portion 108 is not necessarily formed, and a separately prepared substrate in which a source driver circuit is formed may be mounted on the first substrate 102.

In each of the top views of FIGS. 5A to 5D, a hatched area indicates the area provided with the third insulating film 130, while a non-hatched area indicates the area without the third insulating film 130.

Figure 5D:
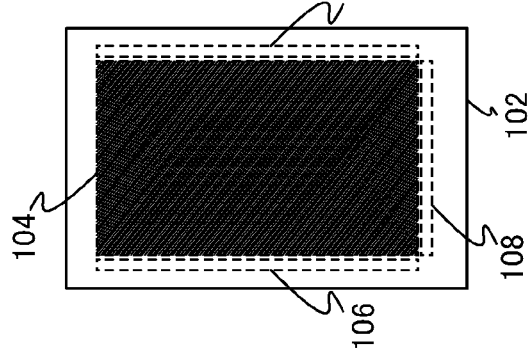

In the display device illustrated in FIG. 5A, the third insulating film 130 is placed only in the pixel portion 104, in other words, the opening portion is formed in the gate driver circuit portions 106 and also in the outer peripheral end of the panel (i.e., in a non-display region). In addition, in the display device illustrated in FIG. 5B, opening portions are formed only in the gate driver circuit portions 106 and the source driver circuit portion 108. In the display device illustrated in FIG. 5C, opening portions are formed in parts of the gate driver circuit portions 106 and parts of the source driver circuit portion 108 (e.g., over the driving transistor). In addition, FIG. 5D illustrates a structure in which the third insulating film 130 is formed entirely in the display device, and is a mode for reference, which is different from one embodiment of the present invention.

Figure 3A:
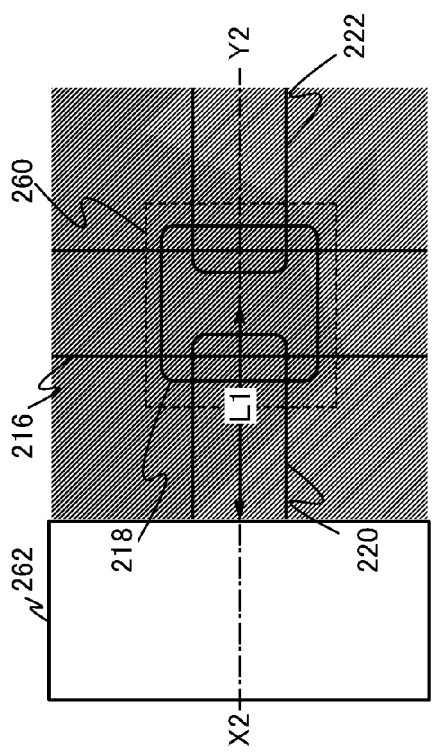
FIG. 3A is a top view of a semiconductor device that is used for evaluation of the influence of a gas such as moisture released from a second insulating film.
Figure 3B:
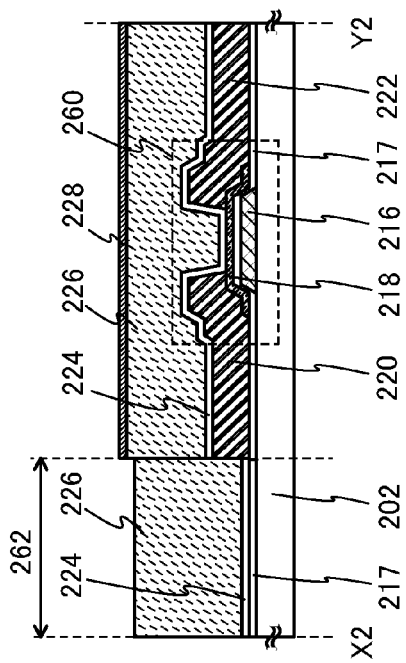
FIG. 3B is a cross-sectional vide taken along the line X2-Y2 in FIG. 3A.

The influence on a transistor, of a gas of moisture and the like released from the second insulating film 126 illustrated in FIG. 2 was evaluated by using a semiconductor device having a structure illustrated in FIGS. 3A and 3B.

FIG. 3A is a top view of the semiconductor device, and FIG. 3B is a cross-sectional view taken along the line X2-Y2 in FIG. 3A.

The semiconductor device illustrated in FIGS. 3A and 3B includes a substrate 202 and a transistor 260, which includes a gate electrode 216 formed over the substrate 202, a gate insulating film 217 formed over the gate electrode 216, an oxide semiconductor layer 218 formed over the gate insulating film 217, and a source electrode 220 and a drain electrode 222 formed over the oxide semiconductor layer 218. The transistor 260 corresponds to the driving transistor 250 illustrated in FIG. 2.

In addition, a first insulating film 224, a second insulating film 226 over the first insulating film 224, and a third insulating film 228 over the second insulating film 226 are formed over the transistor 260, specifically, over the gate insulating film 217, the oxide semiconductor layer 218, the source electrode 220, and the drain electrode 222. The first insulating film 224, the second insulating film 226, and the third insulating film 228 correspond to the first insulating film 124, the second insulating film 126, and the third insulating film 130, respectively, illustrated in FIG. 2.

Further, an opening portion 262 is formed in a region adjacent to the transistor 260, and the region having the opening portion 262 includes the substrate 202, the gate insulating film 217 formed over the substrate 202, the first insulating film 224 formed over the gate insulating film 217, and the second insulating film 226 formed over the first insulating film 224. In other words, in the opening portion 262, the third insulating film 228 over the transistor 260 is not provided, so that a surface of the second insulating film 226 is exposed.

Conditions of forming the transistor 260 are as follows: a 0.7-mm-thick glass substrate is used as the substrate 202, a 100-nm-thick tungsten film is used as the gate electrode 216, a 400-nm-thick silicon oxynitride film is used as the gate insulating film 217, a 35-nm-thick IGZO (In:Ga:Zn=1:1:1) film is used as the oxide semiconductor layer 218, and a stacked layer of a 50-nm-thick tungsten film, a 400-nm-thick aluminum film, and a 100-nm-thick titanium film is used as the source electrode 220 and the drain electrode 222.

In addition, a stacked layer of a 450-nm-thick silicon oxynitride film and a 200-nm-thick silicon nitride film is used as the first insulating film 224 formed over the transistor 260, a 1.5-μm-thick acrylic resin film is used as the second insulating film 226, and a 50-nm-thick silicon nitride film is used as the third insulating film 228.

The transistor 260 is fabricated and evaluated under the following conditions: the distance between the center of a channel region of the transistor 260 and an end portion of the opening portion 262 in FIG. 3A is defined as L1 and four conditions are given to the distance L1.

FIGS. 4A to 4D show measurement results in electric characteristics of the transistors fabricated under the four conditions.

FIGS. 4A, 4B, 4C, and 4D shows measurement results in electric characteristics of the transistors formed under the four conditions that the distances L1 are 200 μm, 400 min, 700 μm, and 1200 μm, respectively.

The conditions of the transistors of FIGS. 4A to 4D are that the channel length is 3 μm and the channel width is 50 μm. A measurement condition of electric characteristics of the transistors is that a voltage (Vd) between the source electrode and the drain electrode is 1 V. In FIGS. 4A to 4D, the vertical axis represents a drain current (Id) and the horizontal axis represents a gate voltage (Vg). The drain current (Id) when the gate voltage (Vg) is changed from −15V to +15V in steps of 0.25 V is shown.

Figure 4A:
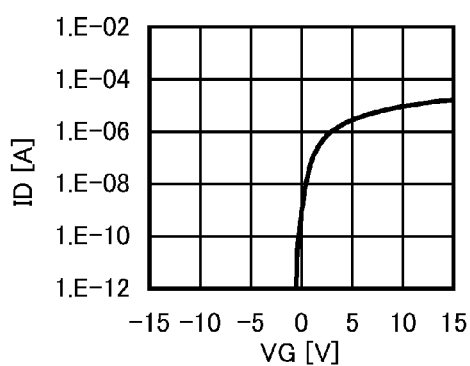
FIGS. 4A to 4D are graphs showing measurement results of electric characteristics of the transistor.
Figure 4C:
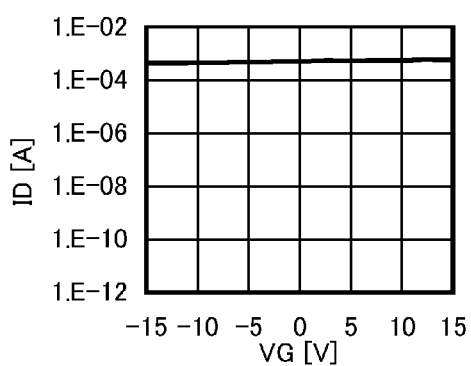
Figure 4B:
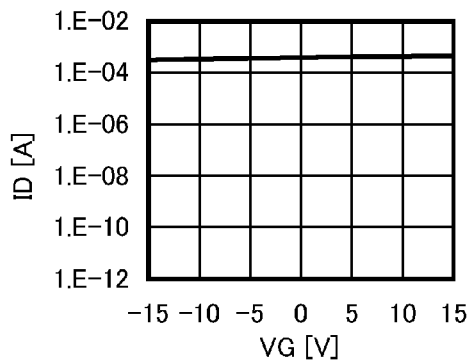
Figure 4D:
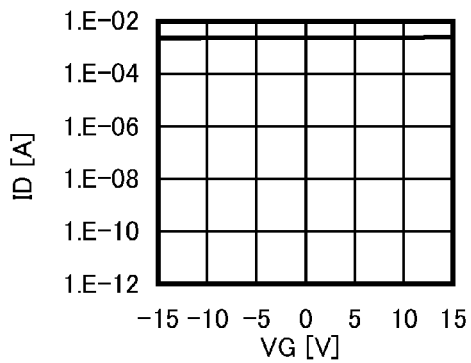

As apparent from FIGS. 4A to 4D, the transistors in FIGS. 4B to 4D are not turned on or off, unlike the measurement result in electric characteristics of the transistor in FIG. 4A. This indicates that the opening portion 262 should be provided in the vicinity of the transistor 260 (where L1 is 200 μm or lower).

As described above, it is confirmed that the distance between the transistor 260 and the end portion of the opening portion 262 has an influence on electric characteristics of the transistor.

Based on the evaluation results of FIGS. 4A to 4D, the present invention can employ a variety of modes regarding to the placement of the driving transistor 250 and the third insulating film 130 in the gate driver circuit portion 106 in FIG. 2 described below.

One embodiment of the present invention is as follows: the gate driver circuit portion 106 includes the third insulating film 130 formed over the second insulating film 126, the third insulating film 130 covers the driving transistor 250, an opening portion is formed in third insulating film 130, and the end portion of the opening portion is formed within the range of 200 μm from the center of the channel formation region of the driving transistor 250.

In other words, one embodiment of the present invention is as follows: the gate driver circuit portion 106 includes the third insulating film 130 formed over the second insulating film 126, the third insulating film 130 covers the driving transistor 250, and the end portion of the third insulating film 130 is formed within the range of 200 μm from the center of the channel formation region of the driving transistor 250.

Further, one embodiment of the present invention is as follows: the gate driver circuit portion 106 includes the third insulating film 130 formed over the second insulating film 126 and an opening portion formed in the third insulating film 130, and the opening portion is formed over the driving transistor 250.

Next, the gate driver circuit portion 106 and the pixel portion 104 illustrated in FIG. 2 are described in detail.

The gate driver circuit portion 106 includes the first substrate 102 and the driving transistor 250, which includes the gate electrode 116 formed over the first substrate 102, the gate insulating film 117 formed over the gate electrode 116, the semiconductor layer 118 formed over the gate insulating film 117, and the source electrode 120 and the drain electrode 122 formed over the gate insulating film 117 and the semiconductor layer 118.

In addition, in the gate driver circuit portion 106, the first insulating film 124 is formed over the driving transistor 250, specifically, over the gate insulating film 117, the semiconductor layer 118, the source electrode 120, and the drain electrode 122, and the second insulating film 126 is formed over the first insulating film 124. In addition, the third insulating film 130 may be provided over a part of the second insulating film 126 in the gate driver circuit portion 106. Note that when the third insulating film 130 is provided, at least a part of the second insulating film 126 should be exposed by forming an opening portion in the third insulating film 130.

The first insulating film 124 serves as a protective film for the driving transistor 250, and the second insulating film 126 serves as a planarization film to reduce unevenness due to the source electrode 120 and drain electrode 122 of the driving transistor 250.

In addition, a first alignment film 134, a liquid crystal layer 136 formed over the first alignment film 134, a second alignment film 138 formed over the liquid crystal layer 136, an organic protective insulating film 142 formed over the second alignment film 138, and the second substrate 110 formed over the organic protective insulating film 142 are formed over the second insulating film 126.

The pixel portion 104 includes the first substrate 102 and the pixel transistor 252, which includes the gate electrode 116 formed over first substrate 102, the gate insulating film 117 formed over the gate electrode 116, the semiconductor layer 118 formed over the gate insulating film 117, the source electrode 120 and the drain electrode 122 formed over the gate insulating film 117 and the semiconductor layer 118.

In addition, in the pixel portion 104, the first insulating film 124 and the second insulating film 126 formed over first insulating film 124 are formed over the pixel transistor 252, specifically, over the gate insulating film 117, the semiconductor layer 118, the source electrode 120, and the drain electrode 122.

The first insulating film 124 serves as a protective film for the pixel transistor 252, while the second insulating film 126 serves as a planarization film to reduce unevenness due to the source electrode 120 and the drain electrode 122, etc., of the pixel transistor 252.

Further, in the pixel portion 104, a capacitor electrode 128 is formed over the second insulating film 126. In addition, the third insulating film 130 formed of an inorganic material is formed over the second insulating film 126 and the capacitor electrode 128. In addition, an opening portion reaching the drain electrode 122 of the pixel transistor 252 is formed in the first insulating film 124, the second insulating film 126, and the third insulating film 130. The pixel electrode 132 is formed in the opening portion and over the third insulating film 130.

Note that a capacitor 254 is made up of the capacitor electrode 128, the third interlayer insulating film 130, and the pixel electrode 132. The capacitor electrode 128, the third interlayer insulating film 130, and the pixel electrode 132 are each preferably formed using a material having the property of transmitting visible light, in which case large capacitance can be ensured without reducing the aperture ratio of the pixel portion.

Over the pixel electrode 132 are formed the first alignment film 134, the liquid crystal layer 136 formed over the first alignment film 134, the second alignment film 138 formed over the liquid crystal layer 136, a counter electrode 140 formed over the second alignment film 138, the organic protective insulating film 142 formed over the counter electrode 140, a colored film 144 and a light-blocking film 146 which are formed over the organic protective insulating film 142, and the second substrate 110 formed over the colored film 144 and the light-blocking film 146.

Note that a liquid crystal element 148, which is a display element, is formed with the pixel electrode 132, the first alignment film 134, the liquid crystal layer 136, the second alignment film 138, and the counter electrode 140.

Here, other components of the display device illustrated in FIGS. 1A to 1C and FIG. 2 are detailed below.

For the first substrate 102 and the second substrate 110, a glass material such as aluminosilicate glass, aluminoborosilicate glass, or barium borosilicate glass is used. In the mass production, for the first substrate 102 and the second substrate 110, a mother glass with any of the following sizes is preferably used: the 8-th generation (2160 mm×2460 mm), the 9-th generation (2400 mm×2800 mm, or 2450 mm×3050 mm), the 10-th generation (2950 mm×3400 mm), and the like. High process temperature and a long period of process time drastically might shrink such a mother glass. Thus, in the case of mass production with the use of such a mother glass, heat treatment in a manufacturing process is preferably performed at a temperature of 600° C. or lower, further preferably 450° C. or lower, still further preferably 350° C. or lower.

For the gate electrode 116, a metal element selected from the group of aluminum, chromium, copper, tantalum, titanium, molybdenum, and tungsten, an alloy containing any of these metal elements as a component, an alloy containing these metal elements in combination, or the like can be used. Further, the gate electrode 116 may have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, a film, an alloy film, or a nitride film which contains aluminum and one or more elements selected from the group of titanium, tantalum, tungsten, molybdenum, chromium, neodymium, and scandium may be used.

Examples of the gate insulating film 117 are a silicon oxide film, a silicon oxynitride film, a silicon nitride oxide film, a silicon nitride film, an aluminum oxide film, a silicon nitride film, a silicon nitride oxide film, and the like, and a single layer or a stacked layer of such films is used as the gate insulating film 117.

The gate insulating film 117 can be formed as a gate insulating film which has few defects and releases less hydrogen and less ammonia, when it is formed to have a stacked structure in which a silicon nitride film having few defects is used as a first silicon nitride film, a silicon nitride film which releases less hydrogen and less ammonia is used as a second silicon nitride film over the first silicon nitride film, and an oxide insulating film is formed over the second silicon nitride film. Thus, transfer of hydrogen and nitrogen, which are contained in the gate insulating film 117, to the semiconductor layer 118 can be inhibited. For example, a stacked structure of a 50-nm-thick silicon oxide film and a 325-nm-thick silicon nitride film can be used as the gate insulating film 117.

The use of a silicon nitride film as the gate insulating film 117 offers the following effect. The silicon nitride film has a higher relative permittivity than a silicon oxide film and thus needs a large thickness to give an electrostatic capacity that is nearly equal to an electrostatic capacity given by a silicon oxide film. Thus, the physical thickness of the gate insulating film can be increased. From the above, the electrostatic breakdown of the transistor can be prevented by inhibiting a reduction in the withstand voltage of the transistor and improving the withstand voltage of the transistor.

The thickness of the gate insulating film 117 is from 5 nm to 400 nm, preferably 10 nm to 450 nm, more preferably 50 nm to 400 nm.

An oxide semiconductor is used for the semiconductor layer 118, which preferably contains at least indium (In) or zinc (Zn) or both In and Zn. In order to reduce variation in electrical characteristics of the transistor including the oxide semiconductor, the oxide semiconductor preferably contains one or more of stabilizers in addition to In and/or Zn.

As a stabilizer, gallium (Ga), tin (Sn), hafnium (Hf), aluminum (Al), zirconium (Zr), and the like can be given.

As the oxide semiconductor, for example, any of the following can be used: indium oxide, tin oxide, zinc oxide, an In—Zn-based metal oxide, a Sn—Zn-based metal oxide, an Al—Zn-based metal oxide, an In—Ga-based metal oxide, an In—Ga—Zn-based metal oxide (also referred to as IGZO), an In—Al—Zn-based metal oxide, an In—Sn—Zn-based metal oxide, a Sn—Ga—Zn-based metal oxide, an Al—Ga—Zn-based metal oxide, a Sn—Al—Zn-based metal oxide, an In—Hf—Zn-based metal oxide, an In—Sn—Ga—Zn-based metal oxide, an In—Hf—Ga—Zn-based metal oxide, an In—Al—Ga—Zn-based metal oxide, an In—Sn—Al—Zn-based metal oxide, an In—Sn—Hf—Zn-based metal oxide, and an In—Hf—Al—Zn-based metal oxide.

Note that an In—Ga—Zn-based metal oxide, for example, is an oxide whose main components are In, Ga, and Zn, and there is no particular limitation on the ratio of In:Ga:Zn. The In—Ga—Zn-based metal oxide may contain a metal element other than In, Ga, and Zn.

Alternatively, a material represented by $InMO_3(ZnO)_m$ (m>0 is satisfied, and m is not an integer) may be used as an oxide semiconductor. Note that M represents one or more metal elements selected from Ga, Fe, Mn, and Co. Alternatively, as the oxide semiconductor, a material expressed by a chemical formula, $In_2SnO_5(ZnO)_n$ (n>0, n is an integer) may be used.

Further, the energy gap of an oxide semiconductor layer that can be used for the semiconductor layer 118 is 2 eV or higher, preferably 2.5 eV or higher, more preferably 3 eV or higher. In this manner, the off-state current of a transistor can be reduced by using an oxide semiconductor layer having a wide energy gap.

In addition, the oxide semiconductor layer used as the semiconductor layer 118 may have an amorphous structure, a single crystal structure, or a polycrystalline structure.

As the oxide semiconductor layer used as the semiconductor layer 118, a c-axis aligned crystalline oxide semiconductor (CAAC-OS) film including crystallized parts may be used.

The CAAC-OS film is not completely single crystal nor completely amorphous. The CAAC-OS film is an oxide semiconductor layer with a crystal-amorphous mixed phase structure where crystal parts and amorphous parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not observed. Thus, in the CAAC-OS film, a reduction in electron mobility resulting from the grain boundary is not caused.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of an a-axis and a b-axis of one crystal part may be different from those of another crystal part. In this specification, a simple term "perpendicular" includes a range from 85° to 95°. In addition, a simple term "parallel" includes a range from −5° to 5°. Note that part of oxygen included in the oxide semiconductor layer may be substituted with nitrogen.

In the CAAC-OS film, distribution of crystal parts is not necessarily uniform. For example, in the formation process of the CAAC-OS film, in the case where crystal growth occurs from a surface side of the oxide semiconductor layer, the proportion of crystal parts in the vicinity of the surface of the CAAC-OS film is higher than that in the vicinity of the surface where the CAAC-OS film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is parallel to a normal vector of the surface where the CAAC-OS film is formed or a normal vector of the surface of the CAAC-OS film. The crystal part is formed by film formation or by performing treatment for crystallization such as heat treatment after film formation.

With the use of the CAAC-OS film in a transistor, change in electric characteristics of the transistor due to irradiation with visible light or ultraviolet light is small. Thus, the transistor has high reliability.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

Furthermore, preferably, the proportion of oxygen in the deposition gas is increased and the power is optimized in order to reduce plasma damage at the deposition. The proportion of oxygen in the deposition gas is 30 vol % or higher, preferably 100 vol %.

The thickness of the oxide semiconductor layer used as the semiconductor layer 118 is from 1 nm to 100 nm, preferably from 3 nm to 85 nm.

The concentration of an alkali metal or an alkaline earth metal in the oxide semiconductor layer used as the semiconductor layer 118, which is measured by secondary ion mass spectrometry (SIMS), is preferably $1 \times 10^{18}$ atoms/cm$^3$ or lower, more preferably $2 \times 10^{16}$ atoms/cm$^3$ or lower. This is because an alkali metal and an alkaline earth metal are bonded to an oxide semiconductor to generate carriers in some cases and thus cause an increase in off-state current of the transistor.

Further, the hydrogen concentration in the oxide semiconductor layer used for the semiconductor layer 118, which is measured by secondary ion mass spectrometry, is lower than $5 \times 10^{18}$ atoms/cm$^3$, preferably $1 \times 10^{18}$ atoms/cm$^3$ or lower, more preferably $5 \times 10^{17}$ atoms/cm$^3$ or lower, still more preferably $1 \times 10^{16}$ atoms/cm$^3$ or lower.

Hydrogen contained in the oxide semiconductor layer reacts with oxygen bonded to a metal atom to produce water, and a defect is formed in a lattice from which oxygen is released (or a portion from which oxygen is removed). In addition, a bond of part of hydrogen and oxygen causes generation of electrons serving as carrier. Thus, the impurities containing hydrogen are reduced as much as possible in the step of forming the oxide semiconductor layer, whereby the hydrogen concentration in the oxide semiconductor layer can be reduced. Accordingly, the oxide semiconductor layer from which hydrogen is removed as much as possible is used for a channel region, whereby a negative shift of a threshold voltage can be inhibited and fluctuation in electrical characteristics can be reduced. Further, leakage current between a source and a drain of a transistor, typically off-state current, can be reduced.

The source electrode 120 and the drain electrode 122 are formed to have a single-layer structure or a stacked-layer structure including, as a conductive material, any of metals such as aluminum, titanium, chromium, nickel, copper, yttrium, zirconium, molybdenum, silver, tantalum, and tungsten or an alloy containing any of these metals as its main component. For example, a single-layer structure of an aluminum film containing silicon, a two-layer structure in which a titanium film is stacked over an aluminum film, a two-layer structure in which a titanium film is stacked over a tungsten film, a two-layer structure in which a copper film is formed over a copper-magnesium-aluminum alloy film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used.

The source electrode 120 and the drain electrode 122 are provided over the semiconductor layer 118 in this embodiment but may be provided between the gate insulating film 117 and the semiconductor layer 118.

As the first insulating film 124, an oxide insulating film of an inorganic material is preferably used so as to improve characteristics of the interface with the oxide semiconductor layer used for the semiconductor layer 118. For example, a silicon film containing oxygen or nitrogen may be used. As the first insulating film 124, a silicon oxide film, a silicon oxynitride film, an aluminum oxide film, or the like having a thickness of from 150 nm to 400 nm can be used. The first insulating film 124 may have a stacked-layer structure of an oxide insulating film and a nitride insulating film. For example, the first insulating film 124 can have a stacked-layer structure of a silicon oxynitride film and a silicon nitride film. Specifically, a stacked-layer structure in which a 150-nm-thick silicon nitride film is stacked over a 300-nm-thick silicon oxynitride film may be employed, in which case the silicon nitride film serves as a block layer to prevent moisture from entering the semiconductor layer 118 of the transistor, for example. The silicon nitride film is preferably formed at a high temperature in order to enhance its blocking property, for example, a substrate temperature of 350° C. is possible. When a cross-section of the transistor as a sample is observed with a scanning electron microscope, in the step resulting from the source and drain electrodes, the silicon nitride film in the upper layer has no cavities reaching the second insulating film even when the silicon oxynitride film in the lower layer has cavities; therefore, it is observed that the first insulating film 124 favorably covers the source and drain electrodes. When the silicon nitride film is formed at a high temperature, a phenomenon that oxygen is released from the oxide semiconductor layer used as the semiconductor layer 118 and the carrier density is increased is caused in some cases; therefore, the upper limit of the temperature is a temperature at which the phenomenon is not caused.

Further, the second insulating film 126 can be formed using an organic material having heat resistance, such as a polyimide-based resin, an acrylic-based resin, a benzocyclobutene-based resin, a polyamide-based resin, or an epoxy-based resin. Note that the second insulating film 126 may be formed by stacking a plurality of insulating films formed using any of these materials. With the use of the second interlayer insulating film 126, the unevenness in the transistor and the like can be reduced.

The capacitor electrode 128 and the pixel electrode 132 each can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

As the third insulating film 130, an inorganic insulating material such as a silicon oxide film, a silicon oxynitride film, a silicon nitride oxide film, a silicon nitride film, or an aluminum oxide film can be used.

For the first alignment film 134 and the second alignment film 138, an organic material having heat resistance such as an acrylic-based resin, a polyimide-based resin, a benzocyclobutene-based resin, a polyamide-based resin, or an epoxy-based resin can be used.

For the liquid crystal layer 136, a liquid crystal material such as thermotropic liquid crystal, low-molecular liquid crystal, high-molecular liquid crystal, polymer dispersed liquid crystal, ferroelectric liquid crystal, or anti-ferroelectric liquid crystal can be used. Such a liquid crystal material exhibits a cholesteric phase, a smectic phase, a cubic phase, a chiral nematic phase, an isotropic phase, or the like depending on conditions.

This embodiment exemplifies the display device using a vertical alignment (VA) mode for the liquid crystal element 148, without being limited thereto. For example, a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

Examples of the vertical alignment mode are a multi-domain vertical alignment (MVA) mode, a patterned vertical alignment (PVA) mode, and the like, and any vertical alignment mode be employed. Moreover, it is possible to use a method called domain multiplication or multi-domain design, in which a pixel is divided into some regions (subpixels) and molecules are aligned in different directions in their respective regions.

Although not illustrated in FIGS. 1A to 1C and FIG. 2, an optical member (optical substrate) such as a polarizing member, a retardation member, or an anti-reflection member may be provided as appropriate. For example, circular polarization may be employed by using a polarizing substrate and a retardation substrate. In addition, a backlight, a side light, or the like may be used as a light source.

As a display method of the pixel portion, progressive scan, interlace scan, or the like can be employed. Further, color elements controlled in a pixel at the time of color display are not limited to three colors: R (red), G (green), and B (blue). For example, one or more colors of yellow, cyan, magenta, and the like can be added to R, G, B, and W (white) or R, G, B. Further, the sizes of display regions may be different between respective dots of color elements. Note that the disclosed invention is not limited to the application to a display device for color display and the disclosed invention can also be applied to a display device for monochrome display.

Further, a spacer 160 is formed on the second substrate 110 side so as to control the distance (cell gap) between the first substrate 102 and the second substrate 110. Note that the cell gap determines the thickness of the liquid crystal layer 136. The spacer 160 may have any shape, like a columnar spacer or a spherical spacer formed by selective etching of an insulating film, or the like.

The colored film 144 functions as a so-called color filter. For the colored film 144, a material having the property of transmitting light in a specific wavelength band may be used, and an organic resin film including a dye or a pigment, or the like can be used.

The light-blocking film 146 functions as a so-called black matrix. As the light-blocking film 146, any film that can block light emitted from adjacent pixels can be used, for example, a metal film or an organic resin film including a black dye or a black pigment can be used.

The organic protective insulating film 142 is provided so that an ionic substance included in the colored film 144 is not dispersed into the liquid crystal layer 136. However, the organic protective insulating film 142 is not necessarily provided, without being limited to that structure.

As the sealant 112, a thermosetting resin, an ultraviolet curable resin, or the like can be used. A region sealed by the sealant 112 illustrated in FIG. 2 has a structure in which the gate insulating film 117 and the first insulating film 124 are placed between the first substrate 102 and the second substrate 110; however, this structure is not a limiting example. For example, in the region sealed by the sealant 112, the gate insulating film 117, the first insulating film 124, and the third insulating film 130 may be formed. As illustrated in FIG. 2, in the region sealed by the sealant 112, the second insulating film 126 formed of an organic material is preferably removed, because penetration of moisture and the like from outside is not caused.

The display device in accordance with one embodiment of the present invention has been described above, and fluctuation in electric characteristics of the transistor having a channel formed in the oxide semiconductor layer used in the display device can be inhibited and further the reliability of the display device can be improved. In particular, penetration of water, moisture, and the like into the oxide semiconductor layer used in the transistor in the driver circuit portion is inhibited so that fluctuation in electric characteristics can be inhibited and further the reliability can be improved.

Furthermore, one embodiment of the present invention can be applied to electronic devices having the display device described above.

EXAMPLE

In Example, a liquid crystal display panel in which a pixel portion and a driver circuit portion were formed over the same substrate was used as an example of a display device, and the display panel with or without an opening portion formed in a third insulating film was subjected to a reliability test. The result of the reliability test is described below.

In the liquid crystal display panel used in Example, the transistors described in the above embodiment were used for a pixel portion and a driver circuit portion. As a semiconductor layer of the transistors, an In—Ga—Zn based oxide semiconductor layer (hereinafter referred to as an IGZO film) was used. Note that the IGZO film was formed by a sputtering method using a target having a composition of In:Ga:Zn=1:1:1, and the thickness thereof was 70 nm.

In addition, as the first insulating film of each of the transistors, a stacked-layer structure in which a 150-nm-thick silicon nitride film was stacked over a 300-nm-thick silicon oxynitride film was used. Note that the silicon nitride film used for the first insulating film was formed at a substrate temperature of 350° C. A 2.5-μm-thick acrylic resin was used as the second insulating film, while a 180-nm-thick silicon nitride film was used as the third insulating film.

Here, the reliability test of the transistors structured above was performed. As the reliability test, an aging test for operation under a high-temperature and high-humidity environment was conducted at a temperature of 70° C., at a humidity of 95% for 200 hours.

The liquid crystal display panel used in Example employed the structure illustrated in FIG. 5A in the above embodiment. A liquid crystal display panel used for Comparative Example employed the structure illustrated in FIG. 5D in the above embodiment, in which no opening portions were formed in the third insulating film. Four samples were fabricated as the liquid crystal display panels for each of Example and Comparative example, and were subjected to the reliability test.

Results of the reliability test are shown in Table 1.

TABLE 1

|  | Example | Comparative Example |
|---|---|---|
| Sample 1 | ○ | x |
| Sample 2 | ○ | x |
| Sample 3 | ○ | ○ |
| Sample 4 | ○ | ○ |

In Table 1. "○" means that the sample functioned normally in the reliability test while "x" means that the sample functioned abnormally due to characteristic degradation of the transistor in a driver circuit in the reliability test.

As shown in Table 1, all of the four samples of the liquid crystal display panels in Example functioned normally in the reliability test, because the opening portions were formed in the third insulating film. In other words, a 100% yield is obtained. On the other hand, two of the four samples as the liquid crystal display panels in Comparative Example functioned abnormally in the reliability test, because no opening portions were formed in the third insulating film. In other words, a 50% yield is obtained. Accordingly, it is confirmed that the formation of the opening portions in the third insulating film drastically increases the reliability of the liquid crystal display panel, as described here in Example.

Note that Example can be implemented in combination with Embodiment described in this specification as appropriate.

This application is based on Japanese Patent Application serial no. 2012-238918 filed with Japan Patent Office on Oct. 30, 2012, the entire contents of which are hereby incorporated by reference.

What is claimed is:

1. A display device comprising:
  a pixel portion comprising:
    a pixel transistor;
    a first insulating film including an inorganic material and covering the pixel transistor;
    a second insulating film including an organic material over the first insulating film; and
    a third insulating film including an inorganic material over the second insulating film; and
  a driver circuit portion outside the pixel portion, the driver circuit portion comprising:
    a driving transistor configured to supply a signal to the pixel transistor;
    the first insulating film covering the driving transistor; and
    the second insulating film over the first insulating film,
  wherein the third insulating film includes an opening portion over the driving transistor,
  wherein the third insulating film does not overlap a semiconductor layer of the driving transistor,
  wherein the pixel portion and the driver circuit portion are over a substrate,
  wherein the substrate comprises a fifth region,
  wherein an entire region of the fifth region and an entire region of the pixel portion overlap each other, and
  wherein the third insulating film does not overlap any region of the substrate other than the fifth region.

2. The display device according to claim 1 comprising a non-display region outside the driver circuit portion,
  the non-display region comprising:
    the second insulating film over the first insulating film, and
    a third region in which the third insulating film is not formed over the second insulating film or a fourth region in which the second insulating film is not covered with the third insulating film.

3. The display device according to claim 1,
  wherein a channel of each of the pixel transistor and the driving transistor is formed in an oxide semiconductor layer, and
  wherein the semiconductor layer of the driving transistor is the oxide semiconductor layer of the driving transistor.

4. The display device according to claim 3, wherein the oxide semiconductor layer contains at least one oxide selected from the group consisting of indium oxide, tin oxide, and zinc oxide.

5. The display device according to claim 3, wherein the oxide semiconductor layer is an In—Ga—Zn based oxide semiconductor layer.

6. The display device according to claim 3, wherein the oxide semiconductor layer includes a crystal part, and a c-axis of the crystal part is parallel to a normal vector of a surface where the oxide semiconductor layer is formed.

7. The display device according to claim 1,
  wherein each of the pixel transistor and the driving transistor includes a gate electrode, an oxide semiconductor layer over the gate electrode, and a source electrode and a drain electrode over the oxide semiconductor layer, and
  wherein the semiconductor layer of the driving transistor is the oxide semiconductor layer of the driving transistor.

8. The display device according to claim 1, wherein the first insulating film is a silicon film including at least one of oxygen and nitrogen.

9. The display device according to claim 8, wherein the first insulating film has a stacked-layer structure of a silicon oxynitride film and a silicon nitride film.

10. The display device according to claim 1, wherein the second insulating film is an acrylic-based resin material.

11. The display device according to claim 1, wherein the third insulating film is a silicon film including nitrogen.

12. The display device according to claim 1,
  the pixel portion comprising:
    a first electrode over the second insulating film;
    the third insulating film over the first electrode; and
    a second electrode over the third insulating film.

13. An electronic device including the display device according to claim 1.

14. A display device comprising:
  a pixel portion comprising:
    a pixel transistor;
    a first insulating film including a silicon film including oxygen, the first insulating film covering the pixel transistor;
    a second insulating film including an acrylic-based resin material over the first insulating film; and
    a third insulating film including a silicon film including nitrogen over the second insulating film; and
  a driver circuit portion outside the pixel portion, the driver circuit portion comprising:
    a driving transistor configured to supply a signal to the pixel transistor;
    the first insulating film covering the driving transistor; and
    the second insulating film over the first insulating film,
  wherein the third insulating film includes an opening portion over the driving transistor,
  wherein the third insulating film does not overlap a semiconductor layer of the driving transistor, wherein the pixel portion and the driver circuit portion are over a substrate,
wherein the substrate comprises a first region,
wherein an entire region of the first region and an entire region of the pixel portion overlap each other, and
wherein the third insulating film does not overlap any region of the substrate other than the first region.

15. The display device according to claim 14, the pixel portion comprising:
   a first electrode over the second insulating film;
   the third insulating film over the first electrode; and
   a second electrode over the third insulating film.

16. An electronic device including the display device according to claim 14.

* * * * *